United States Patent
Hornsby et al.

(10) Patent No.: US 7,005,995 B2
(45) Date of Patent: Feb. 28, 2006

(54) SYSTEM AND METHOD FOR REMOTELY DETECTING AND LOCATING DAMAGED CONDUCTORS IN A POWER SYSTEM

(75) Inventors: Rodney M. Hornsby, Madison, AL (US); John M. Maxwell, Jr., Eva, AL (US); Charles R. Schwarz, Huntsville, AL (US)

(73) Assignee: The Boeing Company, Chicago, IL (US)

( * ) Notice: Subject to any disclaimer, the term of this patent is extended or adjusted under 35 U.S.C. 154(b) by 226 days.

(21) Appl. No.: 10/663,600

(22) Filed: Sep. 16, 2003

(65) Prior Publication Data

US 2005/0057259 A1 Mar. 17, 2005

(51) Int. Cl.
*G08B 21/00* (2006.01)

(52) U.S. Cl. .................. 340/635; 340/638; 340/644; 340/652; 324/510; 324/522

(58) Field of Classification Search ........ 340/649–656, 340/635, 638, 639, 640, 644; 324/418, 424, 324/439, 441, 444, 500, 503, 509, 510, 522, 324/528, 535, 533; 361/93.1
See application file for complete search history.

(56) References Cited

U.S. PATENT DOCUMENTS

| | | | |
|---|---|---|---|
| 3,327,170 A | * | 6/1967 | Sonnemann ............ 361/63 |
| 4,556,882 A | | 12/1985 | Brifman et al. |
| 4,884,034 A | * | 11/1989 | Guzman ............... 324/529 |
| 5,479,610 A | | 12/1995 | Roll-Mecak et al. |

(Continued)

FOREIGN PATENT DOCUMENTS

DE  3121409 A1  12/1982

OTHER PUBLICATIONS

John M. Maxwell, Jr., John H. Blumer, Blake Burden; *A Configurable Solid State Power Management and Distribution System*; 2001; 7 pages; Society of Automotive Engineers, Inc.; 2002-01-3210.

(Continued)

*Primary Examiner*—Jeffery Hofsass
*Assistant Examiner*—Jennifer Stone
(74) *Attorney, Agent, or Firm*—Alston & Bird LLP

(57) ABSTRACT

A system is provided for remotely detecting and locating damaged conductors. The system includes at least one slave controller disposed proximate at least one load and electrically connected to the loads via at least one conductor. The slave controller includes at least one solid-state switch capable of controllably altering the input current to the loads, as well as at least one measuring element for measuring at least one parameter associated with the loads and the solid-state switches. The solid-state switch can controllably alter the input current to the loads according to the parameters. The system also includes at least one damaged wire detector electrically connected to the conductors between the slave controller and the loads. The damaged wire detector is capable of detecting and/or locating at least one damaged conductor.

22 Claims, 9 Drawing Sheets

U.S. PATENT DOCUMENTS

| | | | |
|---|---|---|---|
| 5,514,965 A | | 5/1996 | Westwood |
| 5,565,783 A | * | 10/1996 | Lau et al. .................... 324/522 |
| 5,606,482 A | | 2/1997 | Witmer |
| 5,631,545 A | | 5/1997 | Norman et al. |
| 5,717,337 A | | 2/1998 | Kelly |
| 5,726,843 A | | 3/1998 | Arita et al. |
| 5,973,604 A | * | 10/1999 | Eslambolchi et al. ....... 340/635 |
| 6,127,882 A | | 10/2000 | Vargha et al. |
| 6,377,031 B1 | | 4/2002 | Karuppana et al. |
| 6,385,561 B1 | * | 5/2002 | Soraghan et al. ........... 702/185 |
| 6,434,715 B1 | * | 8/2002 | Andersen ..................... 714/39 |
| 6,822,576 B1 | * | 11/2004 | Feight et al. ............... 340/664 |

OTHER PUBLICATIONS

*Tidal Wave of Wiring Requirements to Hit Industry; Air Safety Week*; Jul. 15, 2002, Washington, DC; 10 pages; vol. 16, No. 27; PBI Media.

*New Technology Enhances Electrical System Safety; Air Safety Week*; Sep. 16, 2002, Washington DC; 10 pages; vol. 16, No. 35; PBI Media.

*TDR—Time Domain Reflectometry Analysis*; Granite Island Group—Technical Surveillance Counter Measures; 6 pages; available at <http://www.tscm.com/tdr.html> (visited Nov. 11, 2002).

*Ground Fault Interrupter*, 5 pages; available at <http://hyperphysics.phy-astr.gsu.edu/hbase/electric/gfi2.html> (visited Nov. 25, 2002).

*TDR Tutorial—Introduction to Time Domain Reflectometry—An Introduction to Time Domain Reflectometers*; Granite Island Group—Technical Surveillance Counter Measures; 10 pages; available at <http://www.tscm.com/riprcop.html> (visited Nov. 26, 2002).

* cited by examiner

SYSTEM AND METHOD FOR REMOTELY DETECTING AND LOCATING DAMAGED CONDUCTORS IN A POWER SYSTEM

FIELD OF THE INVENTION

The present invention relates generally to power system maintenance and, more particularly, to a system and method for remotely detecting and locating damaged conductors in a power system.

BACKGROUND OF THE INVENTION

In many industries today, such as the avionics and automotive industries, complex and costly electrical components, systems and subsystems, as well as the electrical power systems powering these components, are interconnected by many bundles of conductors, typically wires, with each bundle including a plurality of wires. Although each wire is typically surrounded by insulation, or sheathing, such wires can become faulty. In this regard, as the wires age, the insulation can breakdown and chaff. In such instances, the wires can contact other wires or other conductive structures, such as framework. Also, strands in aging wires can begin to separate and tear due to vibration, shock and stress on the wires. Stress due to pinching, rubbing, moisture, corrosion, excessive heat and/or lightening strikes also pose risks that can lead to wire damage. Further, tight fitting connection points within connectors can loosen over time when subjected to the same environmental conditions as the conductors, and when subjected to numerous connects and disconnects due to replacement and maintenance of the electrical components, systems, subsystems, and the electrical power systems.

As will be appreciated by those skilled in the art, when the insulation surrounding the wires breaks down or chaffs, or the wire otherwise becomes faulty, undesirable electric arcs or other wire breakdown can occur at one or more locations along the wires, which can lead to breaks or shorts in the system. It will also be appreciated that in many instances, the location of such arc events or other wire breakdowns can be difficult to find. In this regard, the location of an arc event or other wire breakdown may be inside of a bulkhead or inside of a wire bundle. Also, an arc event may only brown an area of occurrence without actually burning through or burning the insulation away form the affected wire.

In many instances, detecting and locating the arc event or other wire breakdown can be difficult, if not impossible. In this regard, detecting a fault in the system as being caused by a faulty wire may be difficult in systems that also include complex electrical components, systems, subsystems and power systems. As such, misdiagnosing a fault in the system as being caused by costly electrical components, for example, can result in unnecessary replacement of such components while still failing to correct the fault.

In addition to the difficulty in detecting an arc event or other wire breakdown, locating such an arc event or other breakdown is also difficult. In many instances, the location of the arc event or other breakdown may be in a location that is impossible to visually locate without extracting a wire bundle from the system. However, inspection of many feet of wire within a system can be very time consuming, and in some cases, may place maintenance personnel at risk for injury. Also, most conventional wire testing equipment is cumbersome and requires unique training of maintenance personnel as to how to use the equipment. Use of such equipment also requires that one or more wire bundles be disconnected in order to test the wires. Unnecessary removal of equipment can also be very costly and time consuming, however, and can add to the required time to perform maintenance on the system. Further, many times such connection points are not located in easily accessed locations.

SUMMARY OF THE INVENTION

In light of the foregoing background, the present invention provides a system and method of remotely detecting and locating damaged conductors. The system and method of embodiments of the present invention are capable of preventing interference to loads during operation by conducting a test on a "dead conductor" before applying power to the load. By pre-testing the wire/load before power is applied, it is possible to prevent power from being applied to a damaged wire/load and may avert an arc event from occurring. The system and method of embodiments of the present invention may further provide the location of damage in a conductor, such as the location of a suspected arc event. By locating the suspected damage, maintenance personnel may advantageously narrow the search for the damage to a specific location, even internal to a wiring bundle, without having to spend countless hours visually inspecting every wire from one end to the other.

According to one aspect of the present invention, a system is provided for remotely detecting and locating damaged conductors. The system includes at least one slave controller disposed proximate at least one load and electrically connected to the loads via at least one conductor. The slave controller includes at least one solid-state switch capable of controllably altering the input current to the loads, as well as at least one measuring element for measuring at least one parameter, such as at least one current parameter, associated with the loads and the solid-state switches. In this regard, the solid-state switch can controllably alter the input current to the loads according to the parameters. Advantageously, the system also includes at least one damaged wire detector electrically connected to the conductors between the slave controller and the loads. The damaged wire detector is capable of detecting and/or locating at least one damaged conductor. Each damaged wire detector can also be capable of notifying a respective slave controller when the damaged wire detector detects a damaged conductor such that the at least one solid-state switch of the respective slave controller can alter the input current to the at least one load.

More particularly, the solid-state switches can operate in an on mode wherein the solid-state switches permit a respective load to receive the input current, and/or an off mode wherein the solid-state switches prevent the respective load from receiving the input current. When the solid-state switches operate in the off mode, the damaged wire detectors are capable of testing the conductors to thereby detect and/or locate at least one damaged conductor before the solid-state switches are placed in the on mode.

The damaged wire detectors can detect and/or locate a damaged conductor in a number of different manners. For example, each damaged wire detector can be capable of detecting and/or locating at least one damaged conductor by transmitting at least one test pulse along at least one respective conductor and receiving at least one reflection from the respective conductors. Thereafter, the respective damaged wire detector can compare the reflections to reference data to thereby detect and/or locate at least one damaged conductor. The damaged wire detector can be further capable of converting the reflected signal into digital data representative of the reflections that are then compared to reference data, such as previously stored reference data.

Each damaged wire detector can be further capable of determining at least one length of the conductors based upon at least one transit time between transmission of the test pulses and reception of the respective reflections. In such instances, each damaged wire detector can be capable of comparing the reflections to reference data by comparing the determined lengths to at least one reference length. In this regard, comparing the determined lengths to the reference lengths can include detecting at least one damaged conductor when the determined lengths are shorter than the respective reference lengths by more than a threshold length. Also, each damaged wire detector can be capable of locating the damage as a point on the respective conductors at the determined lengths.

According to another aspect of the present invention, a method of remotely detecting and locating damaged conductors is also provided. Therefore, embodiments of the present invention provide a system and method for remotely detecting and locating damaged conductors. Embodiments of the present invention allow for non-intrusive testing of the power cables, which reduces wear and tear on cable connectors and keeps maintenance personnel from having to enter cramped quarters to conduct tests. This reduces the potential of secondary damage due to wiring being disturbed by personnel crawling on the wires. Being able to test wiring from external locations can reduce unnecessary vehicle or structure entry and reduce the potential for incidental damage. Cable inspection times can also be reduced due to automated processes and being able to conduct tests from external to system locations.

BRIEF DESCRIPTION OF THE DRAWINGS

Figure 1:
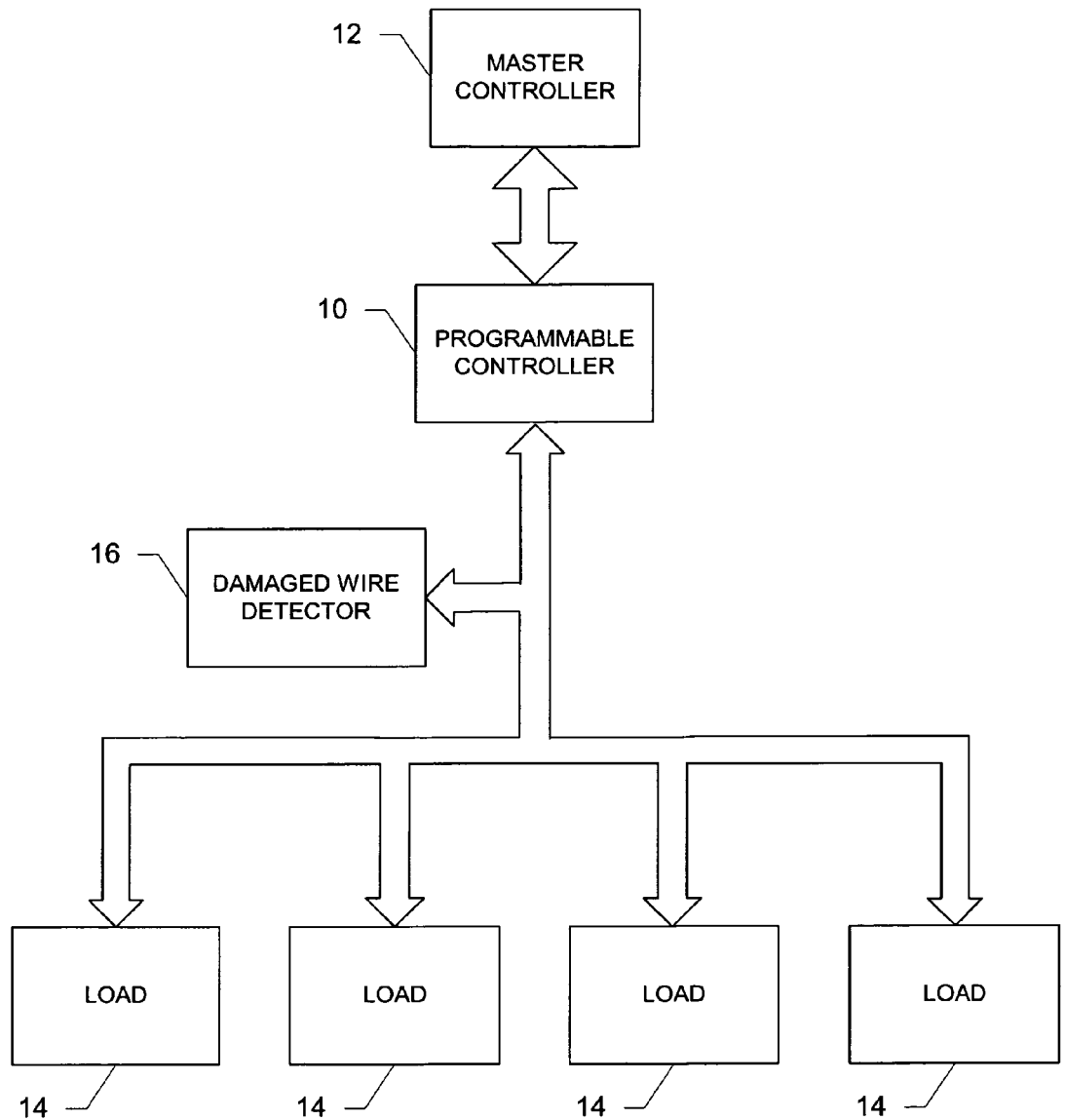
Figure 2:
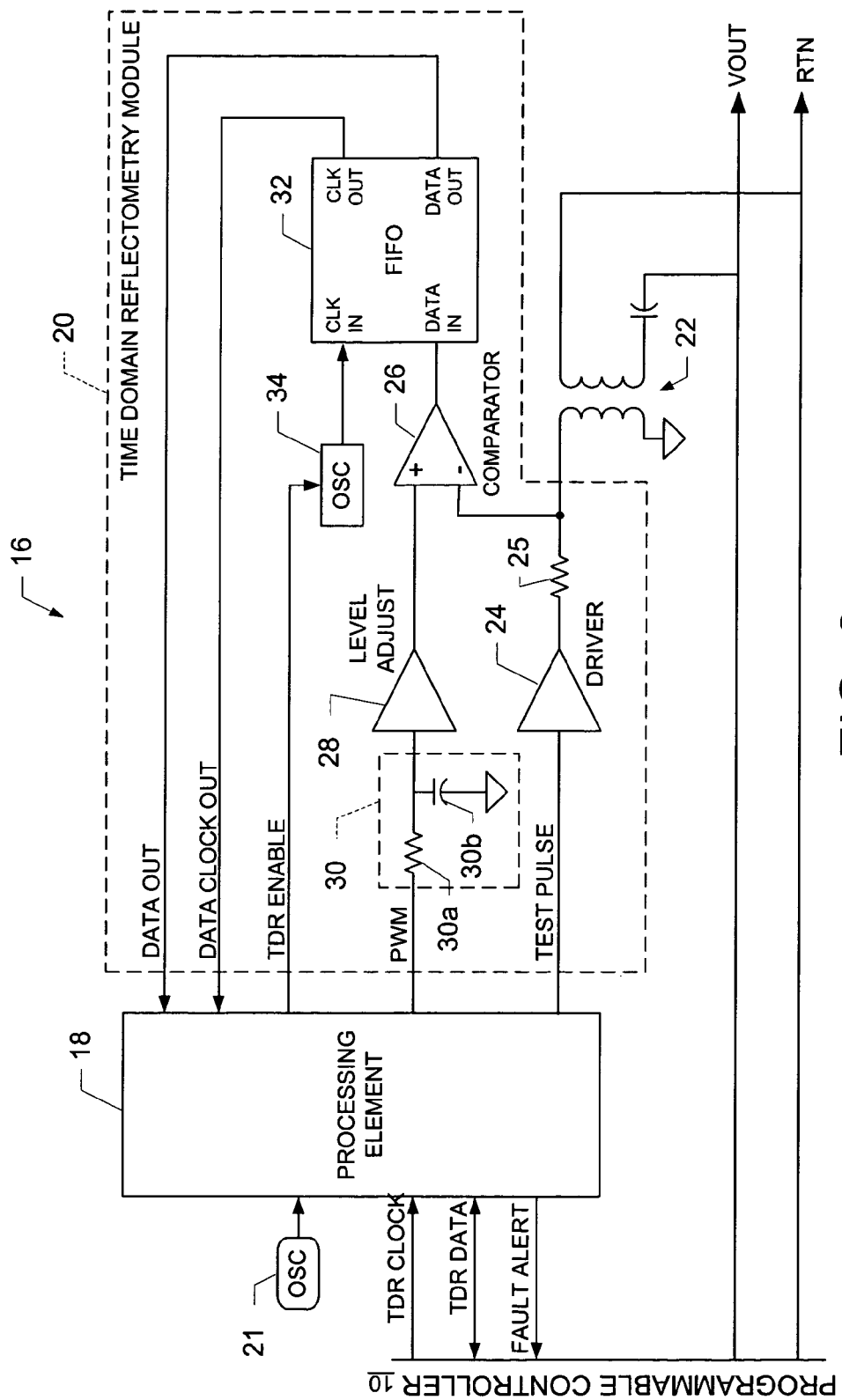
Figure 3:
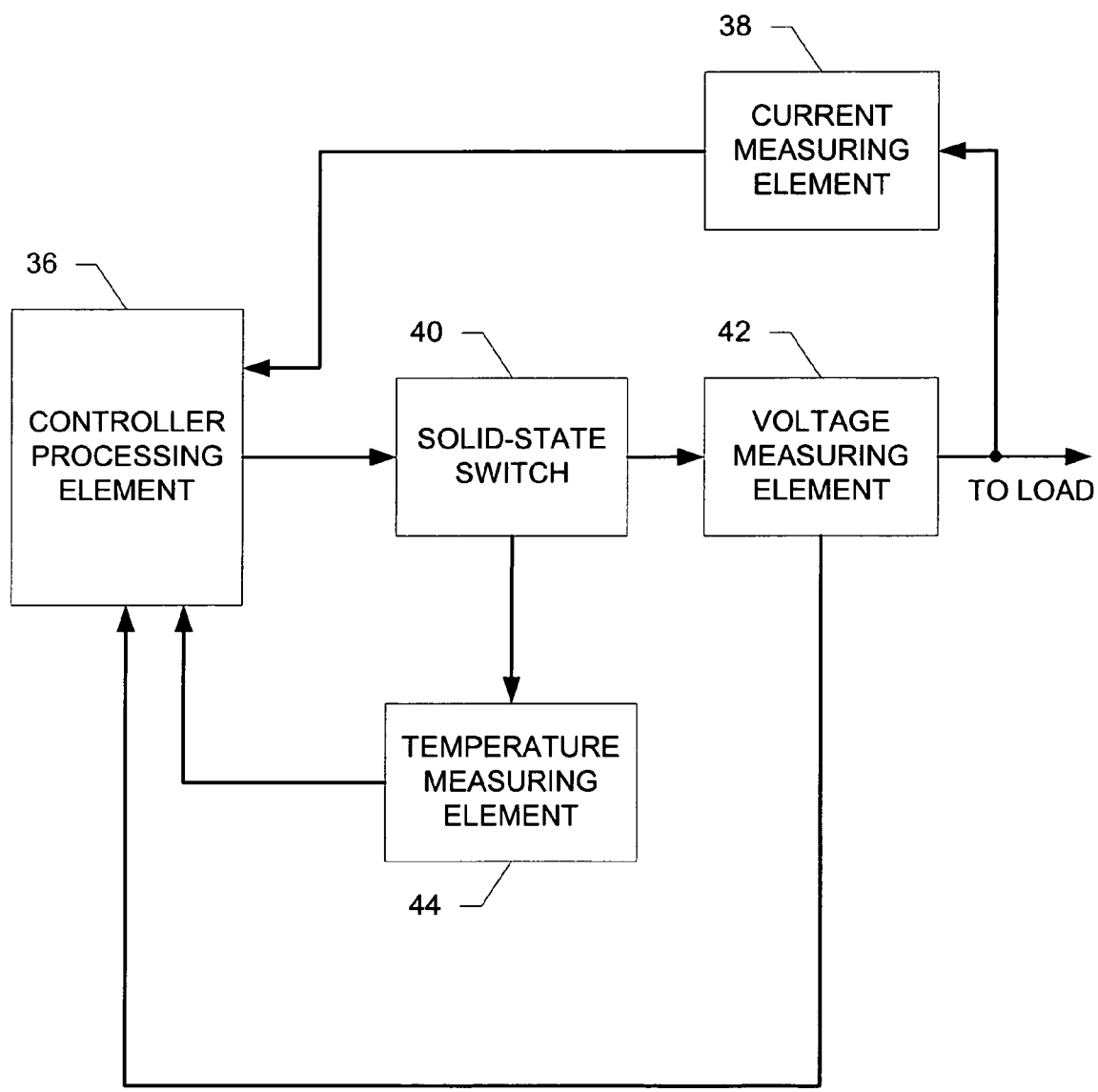
Figure 4:
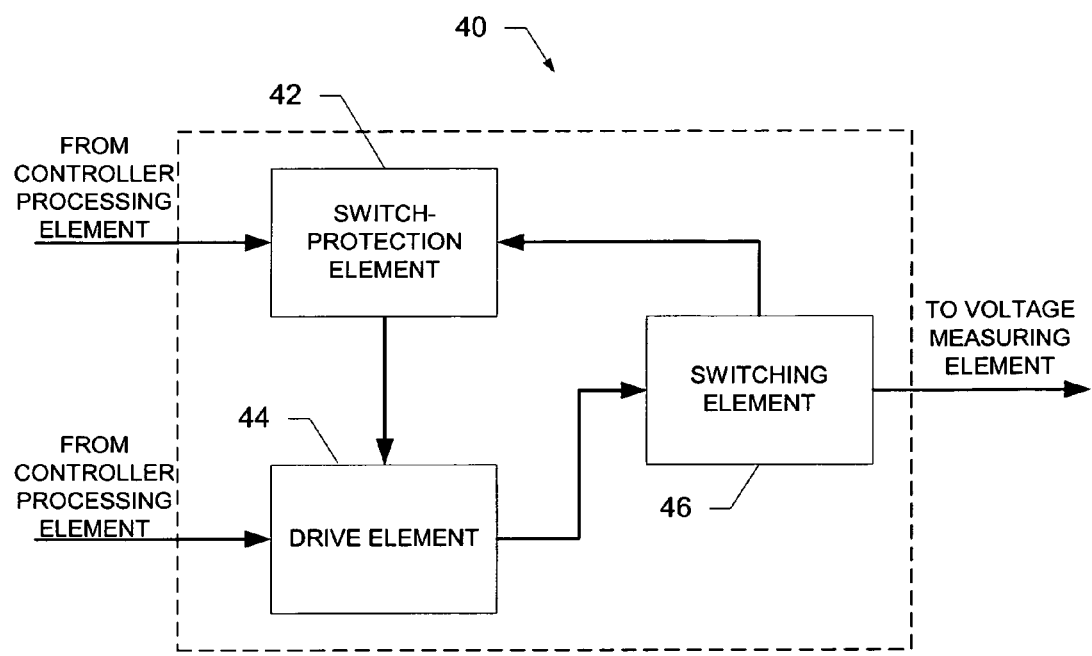
Figure 5:
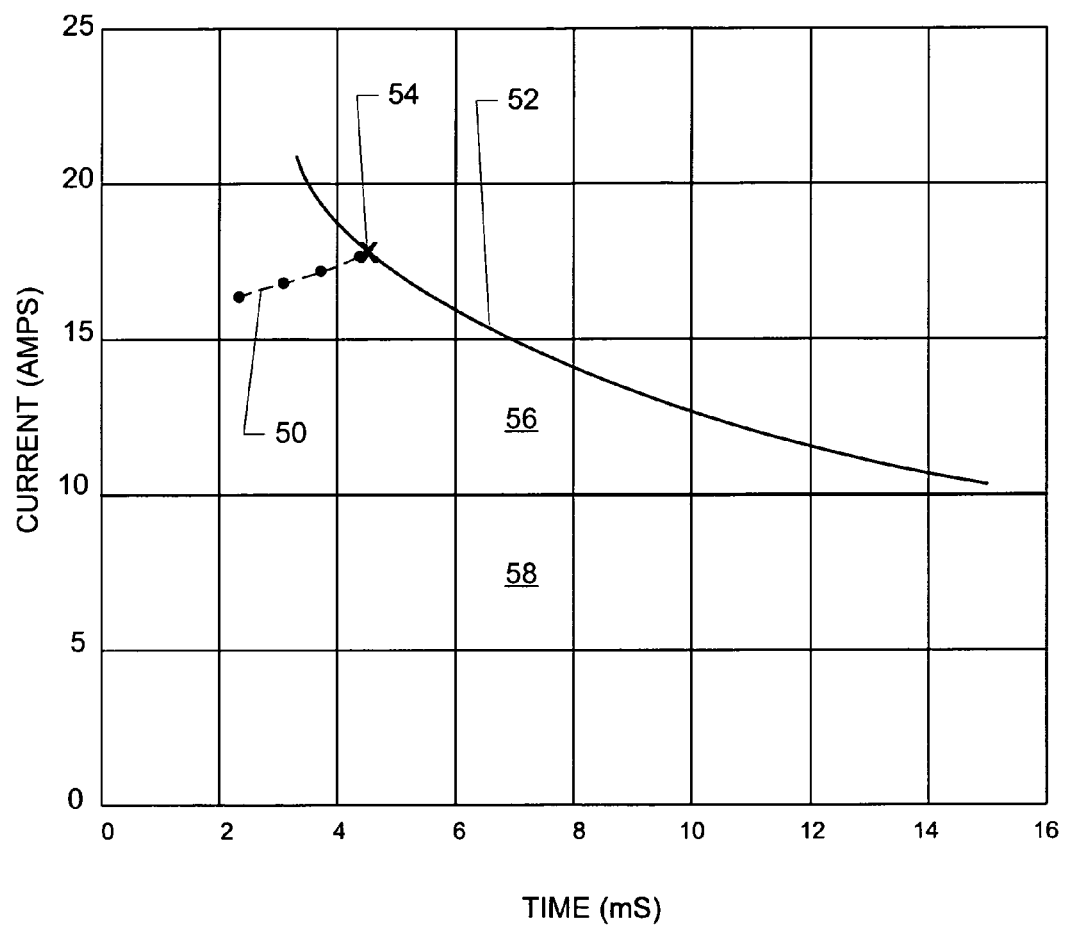
Figure 6A:
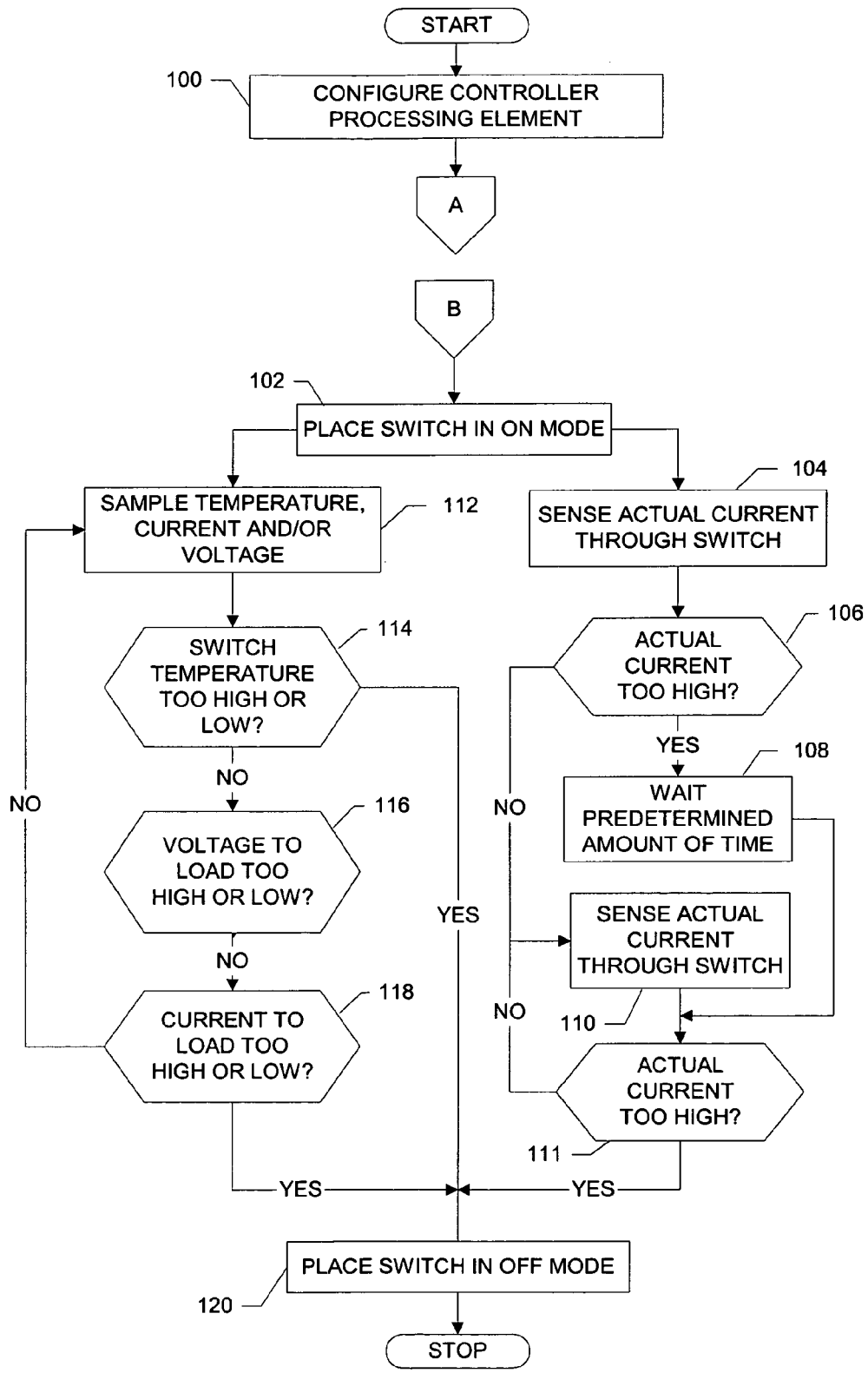
Figure 6B:
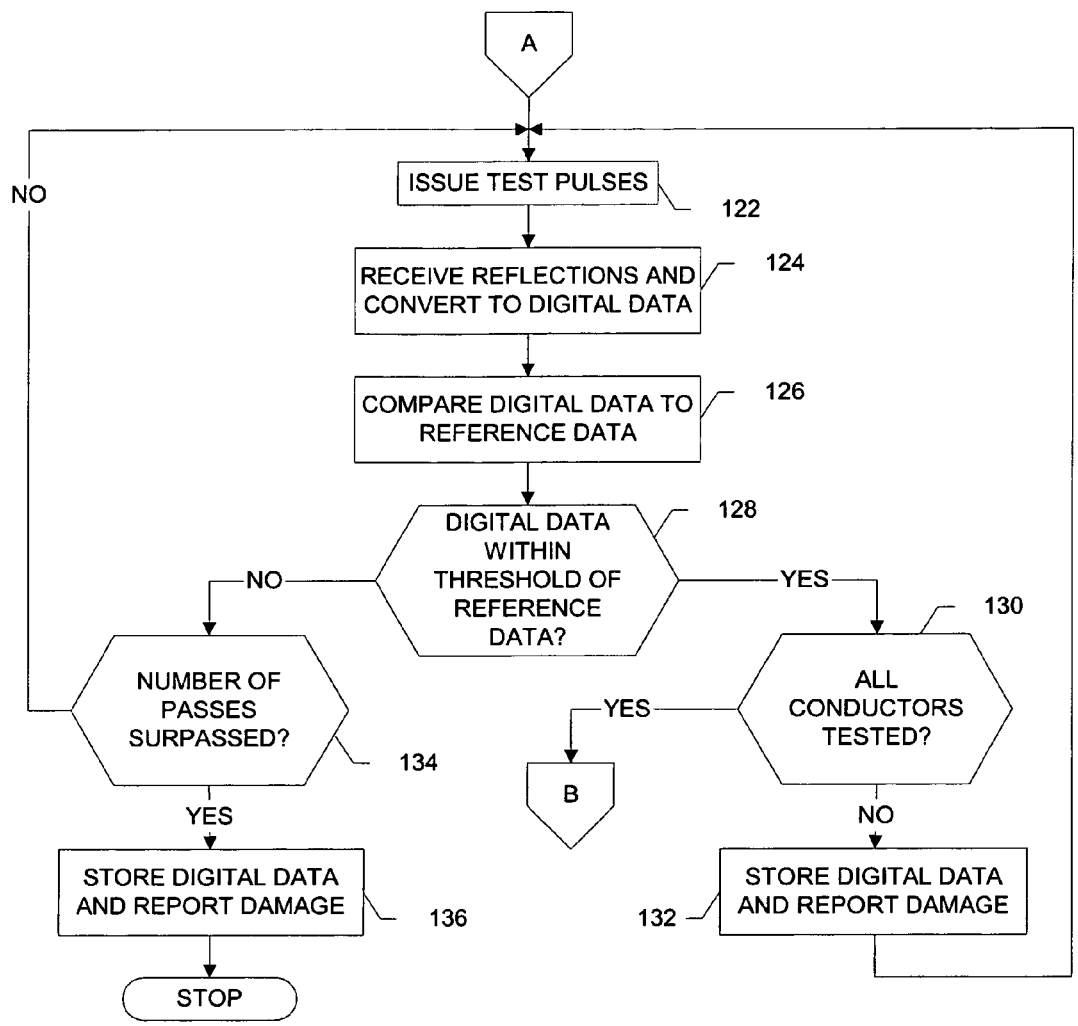
Figure 7:
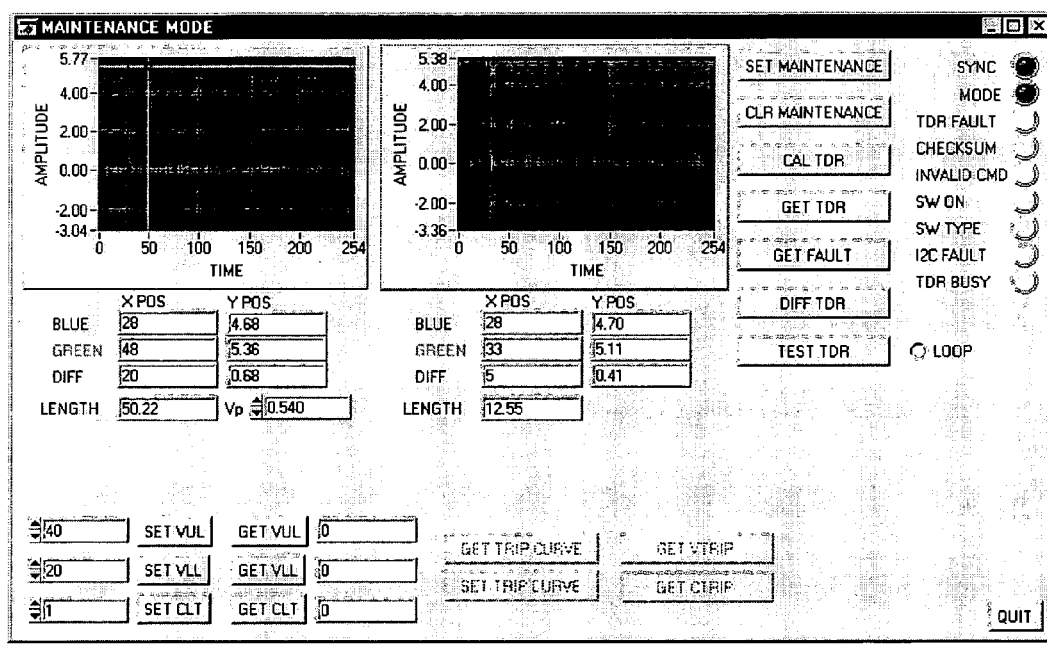
Figure 8:
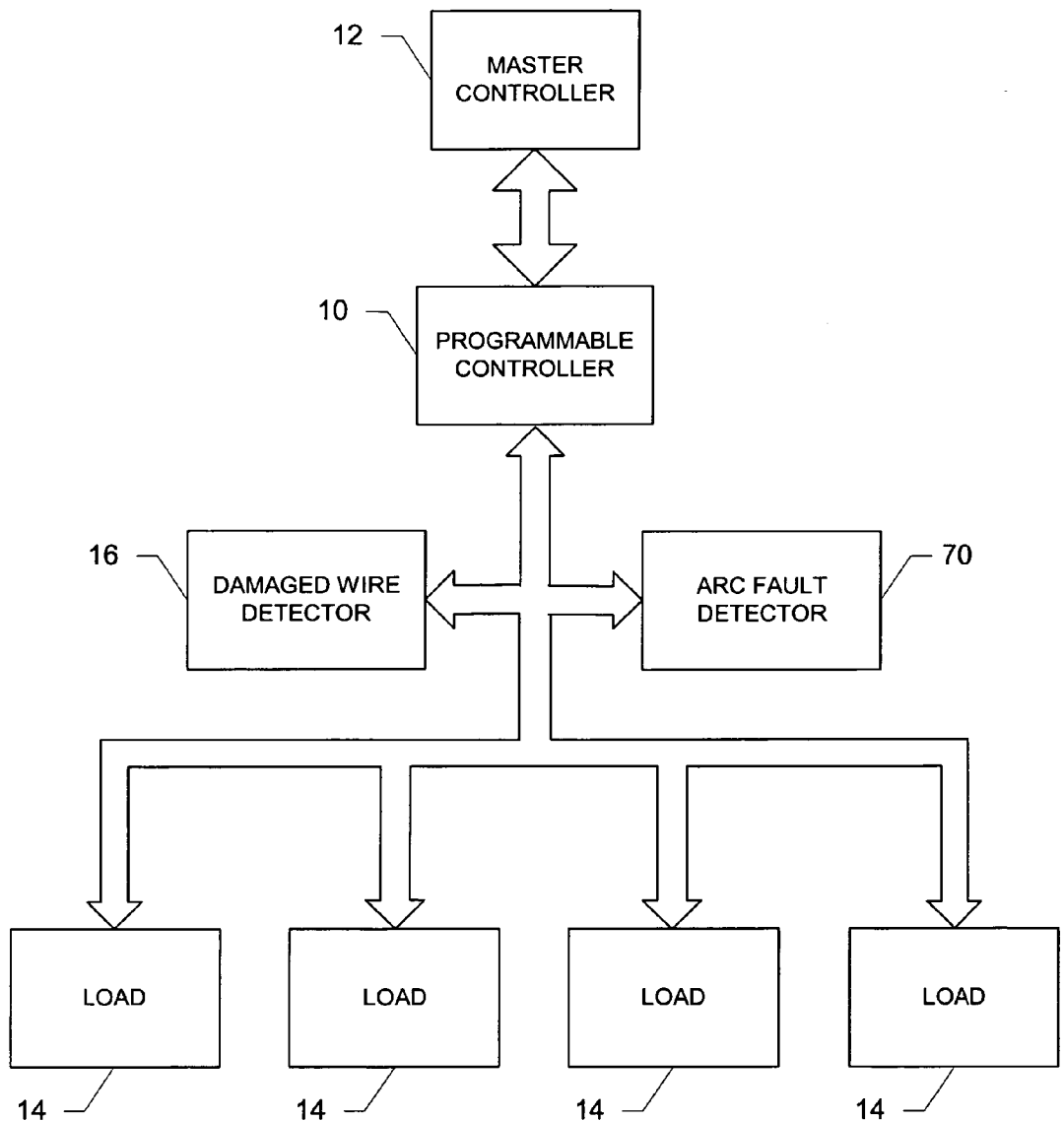

Having thus described the invention in general terms, reference will now be made to the accompanying drawings, which are not necessarily drawn to scale, and wherein:

FIG. 1 is a block diagram of a system of remotely controlling at least one load according to one embodiment of the present invention;

FIG. 2 is a block diagram of a damaged wire detector according to one embodiment of the present invention;

FIG. 3 is a block diagram of a programmable controller including a single solid-state switch and multiple measuring devices according to one embodiment;

FIG. 4 is a block diagram of a solid-state switch according to one embodiment of the present invention;

FIG. 5 is a graph illustrating a characteristic trip curve for a respective load and several current parameter measurements for the respective load;

FIGS. 6A and 6B are flow diagrams of a method of remotely detecting and locating damaged conductors according to one embodiment; illustrating the method with respect to one respective switch and load, although the master controller can, and preferably does, control the input current to multiple loads through multiple switches;

FIG. 7 illustrates graphs that may be presented on a display comparing digital data with reference digital data to locate damage in a conductor, if such damage exists; and FIG. 8 is a block diagram of another embodiment of the present invention including an arc fault detector in addition to the damaged wire detector.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

FIG. 1 is an illustration of a system that would benefit from the damaged wire detector of one embodiment of the present invention. This illustration is provided so that a more complete understanding of the present invention may be appreciated. It must be understood that the present invention is not limited to this configuration and may be embodied in many different power systems.

With regard to FIG. 1, a general embodiment of a power system in which the present invention may be used is shown. The system, typically used to power devices onboard airplanes and automobiles, includes a programmable controller (i.e., slave controller) 10 disposed proximate and electrically connected to at least one load 14, such as one or more electrical components, systems and/or subsystems. For example, the programmable controller can be used to drive electric motors and servos, therefore replacing high maintenance hydraulic devices. The programmable controller can provide either alternating current (AC) current and voltage or direct current (DC) current and voltage to the loads, depending upon operation of the loads. As shown and described herein, however, the programmable controller is particularly adapted to provide DC current and voltage to the loads. But it should be understood that the programmable controller can equally provide AC current and voltage to one or more loads, as desired.

The programmable controller 10 can be electrically connected to the loads 14 via electrical conductors, such as copper wires or the like. By using one programmable controller to control multiple loads, and by disposing the controller proximate the loads as opposed to in one central, humanly accessible location, cabling in the system is reduced which, in turn, reduces parasitic impedance in the system, and reduces the weight of the system. The programmable controller can be electrically connected to a remote master controller 12, such as a high-level processor or computer, which controls the input current to the loads through the programmable controller. Although the programmable controller can be electrically connected to the master controller, the programmable controller can additionally, or alternatively, be configured to operate independent of the master controller or any other type of controller.

Electrically connected between the programmable controller 10 and the loads 14, the system includes a damaged wire detector 16. The damaged wire detector is capable of monitoring the impedance conditions associated with the conductors connecting the programmable controller to the loads, as well as the loads 14. Typically, the conductors are tested before applying power to the loads to thereby prevent malfunction in the system upon applying power to the loads. The damaged wire detector can detect a damaged wire and locate the damage in any of a number of different manners, such as according to a time domain reflectometry technique, as described below.

The programmable controller 10 and the remote master controller 12 can each draw power from a variety of sources as such are known to those skilled in the art. For example, in devices such as airplanes and automobiles, the programmable controller and remote master controller, in addition to the loads 14, can draw power from the device's existing power bus. Additionally, or alternatively, the programmable controller and/or master controller can be connected to a stand-alone power source that supplies power to the programmable controller and/or master controller. The master controller of the system can additionally be connected to various other electrical systems within various devices. For example, in the automotive industry, the master controller can interface with the vehicle management system and carry out the vehicle management system instructions to the loads in an autonomous fashion. It should be understood that, although the system illustrated depicts one programmable controller electrically connected to one master controller, a single master controller can be, and preferably is, electrically connected to multiple remote programmable controllers without departing from the spirit and scope of the present invention. In turn, a damaged wire detector 16 can be, and preferably is, electrically connected between each programmable controller and the loads connected to the respective programmable controller.

As previously mentioned, the master controller 12 controls the input current to the loads 14 through the programmable controller 10. As such, the programmable controller can be used as a power relay or a circuit breaker, depending upon the desired application and the types of loads connected. As discussed below with reference to the programmable controller controlling the loads, the master controller controls the programmable controller by continuously monitoring the programmable controller, controlling the output current from the programmable controller to the loads such as in on and off modes, selecting the various system parameters such as current, voltage and temperature limits, and programming the various system parameters into the programmable controller. Alternatively, or additionally, the programmable controller can be preprogrammed before integration into a device and run free from control from the master controller. Therefore, throughout the description of the present invention, reference will only be made to the programmable controller. But it should be understood that the control features of the programmable controller can be performed by the master controller and/or the programmable controller. For more information on such a programmable controller, see U.S. patent application Ser. No. 09/842,967, entitled: Programmable Controller For Remotely Controlling Input Power Through a Switch to a Load and an Associated Method of Operation, filed Apr. 26, 2001, the contents of which are hereby incorporated by reference in its entirety.

Reference is now drawn to FIG. 2, which illustrates a schematic block diagram of a damaged wire detector 16 according to one embodiment of the present invention. The damaged wire detector includes a processing element 18 capable of controlling operation of a time domain reflectometry (TDR) module 20. As described more fully below, the processing element can be capable of transmitting signals onto the conductors between the programmable controller 10 and the loads 14, and receiving digital data representative of signals reflected back from the conductors. In this regard, the damaged wire detector can include an oscillator 21 capable of driving the processing element to transmit signals and receive the digital data.

In addition to the processing element and oscillator 21, the damaged wire detector can include an isolation transformer 22 capable of injecting a pulse onto the output. The TDR module is capable of transmitting a series of test pulses down the conductors connecting the programmable controller 10 and the loads 14. Each test pulse can propagate down the conductors and, at a termination point, reflect back to the TDR module, which can receive the reflection and thereafter generate digital data representative of the reflection. Thereafter, the processing element 18 can analyze the digital data to determine if a conductor is damaged and attempt to identify a location of the damage.

More particularly, the TDR module 20 can comprise a driver 24 through which each test pulse is driven onto the conductors via the isolation transformer 22. The test pulse can comprise any of a number of different predetermined pulses, such as a 1 microsecond, 5 volt analog pulse. In this regard, the test pulses can be comprise 1 MHz test pulses, which provides 10 nano-second resolution, or on the order of one to two meter distance resolution for typical conductors. If desired, the test pulse can be passed through a resistor 25, such as a 25 Ohm resistor, before passing through the transformer to thereby give the driver an output impedance that forms a driver with the conductor impedance. Upon receiving the reflection back from the conductors via the transformer, the analog reflection can be converted to digital data representative of the reflection by passing through a comparator 26, which compares the analog reflection to an analog pulse width modulated (PWM) controlled DC threshold signal, as such will be appreciated by those skilled in the art.

To allow the TDR module 20 to receive reflections of different magnitudes to thereby detect termination points of different magnitudes and at different lengths along the conductors, the reflection from each test pulse can be converted to digital data with different thresholds. For example, the reflections can be converted to digital data with different thresholds by comparing the reflections to a DC threshold level reference generated from an adjustable PWM signal. In this regard, the magnitude of the threshold signal, and thus the threshold of the resulting digital data, can be set by a level adjust element 28. Also, before passing through the level adjust element, the threshold signal can be filtered, such as by filter 30, which can comprise any of a number of different conventional electrical elements, such as resistors 30a, capacitors 30b or the like. In this regard, the threshold signal can be filtered to generate the DC threshold level reference. The DC threshold level reference can then be scaled and offset to produce threshold level settings for the comparator 26. The threshold level settings can comprise any of a number of different levels, but in one embodiment, the threshold signals range from +7 volts to −7 volts in approximately 0.78 volt increments.

After converting the analog reflections to digital data representative of the reflections, the digital data can be passed to the processing element 18 for analysis to determine if a conductor is damaged and attempt to identify a location of the damage. The digital data can be passed to the processing element in any of a number of different manners, such as by being passed directly to the processing element. In a more typical embodiment, however, the digital data is passed to a buffer, such as a first-in-first-out (FIFO) buffer 32, which thereafter passes the digital data to the processing element. The FIFO buffer can comprise any of a number of known FIFO buffers, such as a 512×1 FIFO buffer. The FIFO buffer permits the processing element 18 to control the TDR module 20 to generate test pulses at a frequency of 1 MHz (i.e., 1 microsecond test pulses), while receiving the digital data at a lower rate. Operation of the FIFO can be controlled by an oscillator 34 that, in turn, is controlled by the processing element. In this regard, receipt by the processing element of the digital data can be controlled by controlling the oscillator. As such, the processing element can enable operation of the TDR module 20 via control of the oscillator.

The oscillator 34 can clock the digital data into the FIFO buffer 32 from the comparator 26 at any of a number of different rates such as, for example, at 100 MHz. Similarly, the oscillator can clock the digital data from the FIFO buffer to the processing element 18 at any of a number of different rates, such as at 100 MHz. In addition to passing the digital data to the processing element, the FIFO buffer can also output the clock signal from the oscillator 34 to the processing element. In this regard, the processing element can receive the digital data and associated clock signals such that the processing element can synchronize the digital data with reference data for comparison to determine if the conductors are damaged.

More particularly, the processing element 18 can compare the digital data with reference data in memory to determine if the conductors are damaged. As will be appreciated by those skilled in the art, according to the time domain reflectometry technique, as the test pulses are transmitted down the conductors, all or part of the pulse energy is reflected back along the conductors when the pulses reach the end of the conductor or reach a location that has been damaged along the length of the conductor. The processing element can then measure the transit time required for each test pulse to travel down the conductors and reflect back, and convert the time to distance, which is thereafter compared to a reference length. The reference length can be determined in any number of different manners, such as from the reference data. The reference data, in turn, can comprise data stored in memory, such as during "calibration" of the TDR module 20. As will be appreciated, distances determined from the digital data that are significantly shorter than corresponding distances determined from the reference data can be regarded as locations of damage along the length of the conductors. The differences between the distances determined from the digital data and the corresponding distances determined from the reference data required to indicate a location of damage can be selected in any of a number of different manners to provide any of a number of different levels of tolerance of the system. For example, the difference required to indicate the location of damage can be selected to be greater than five percent of the distance determined from the reference data.

The processing element 18 is capable of communicating with the programmable controller 10. In this regard, the programmable controller can clock data into and out of the processing element, such as distances determined from the digital data and/or the reference data, utilizing signal lines TDR CLOCK and TDR DATA as shown in FIG. 2. In addition, the processing element can transmit a notification, alert or the like to the programmable controller, such as when the differences between the distances determined from the digital data and the corresponding distances determined from the reference data required to indicate a location of damage exceed a threshold, as described more fully below. As shown in FIG. 2, then, such a notification, alert or the like can be transmitted to the programmable controller utilizing the FAULT ALERT signal line.

Referring now to FIG. 3, the programmable controller 10 of one embodiment of the present invention includes a controller processing element 36. The controller processing element can be any of a variety of processors, such as, for example, the PIC17C752 microcontroller manufactured by Microchip Technology Inc. The controller processing element monitors and controls the functions of at least one, and preferably multiple, solid-state switches 40, discussed below. Not only does the controller processing element monitor and control the functions of the switches, the controller processing element also determines a condition of the switches and/or loads by performing calculations in the firmware using preconfigured characteristics and measured parameters of the switches and/or loads. The controller processing element allows the programmable controller to provide flexibility to the power system of the present invention not available with conventional circuit breakers or relays. By emulating the material limitations of conventional circuit breakers and relays with firmware, the controller processing element of the programmable controller overcomes the material limitations of conventional circuit breakers and relays, by having the capability to reprogram the controller processing element for different loads, as opposed to changing discrete components (i.e., conventional circuit breakers and relays). Also, the programmable controller allows for a wide variety of power control implementations to be programmed and made selectable by the system, such as various trip-curve implementations. In addition, the controller processing element can caution an operator if a dangerous condition is encountered, or the controller processing element can automatically control the respective switch accordingly.

The programmable controller 10 also includes at least one, and preferably more than one, solid-state switch 40, each connected to a respective load 14. While the illustration of FIG. 3 depicts only a single solid-state switch, it should be understood that the figure is for illustrative purposes only, and should not be taken to limit the scope of the present invention. In one embodiment, illustrated in FIG. 4, each solid-state switch includes a switching element 49, a drive element 48 and a switch-protection element 46. While the switching element can comprise any number of different solid-state switches, such as a MOSFET or an IGBT, the switching element acts to alter the input current to the respective load, typically operating in either an on mode wherein the switching element permits the respective load to receive the input current, or an off mode wherein the switching element prevents the respective load from receiving the input current. As previously stated, a solid-state switch eliminates the mechanical contacts of conventional circuit breakers and relays which, in turn, reduces the erosion and other problems associated with mechanical contacts.

The solid-state switch 40 also includes a drive element 48 that provides the input current to the switching element 49, and typically comprises circuitry consisting of conventional electrical components such as resistors, diodes and transistors. Additionally, the solid-state switch may include a switch-protection element 46 that protects the switching element against instantaneous over-current conditions that could damage the switching element. The switch-protection element can comprise any of a number of different configurations, but, like the drive element, typically comprises conventional electrical components such as diodes, transistors, resistors and capacitors.

In operation, the switch-protection element 46 senses an actual current through the switching element 49. If the actual current is above a predetermined value, such as a maximum current rating of the switching element, the switch-protection element alters the actual current through the switching element so that the actual current is no more than the predetermined value, typically placing the switching element in the off mode. In some instances when the solid-state switch 40 is initialized at start-up, an inrush of actual current flows through the switching element. But while this current may be above the predetermined value, it typically settles down to a level at or below the predetermined value within a fairly short time. To account for this inrush of current and prevent the switch-protection element from prematurely altering the input current, the switch-protection element of one embodiment is capable of waiting a predetermined amount of time before monitoring the level of current through the switching element. This predetermined amount of time allows the level of current to settle to a more constant, operation level before the switch-protection element monitors the switching element for instantaneous over-current situations. Additionally, or alternatively, the switch-protection element can be configured to control the actual current in different manners at different times or in different modes of operation. For example, the switch-protection element can be configured to step down the predetermined value at which current is interrupted from an initial, elevated value to a stable, constant value at the conclusion of the predetermined amount of time.

Referring again to FIG. 3, the programmable controller 10 of the present invention includes at least one, and preferably more than one, measuring element that measures various conditions of the loads 14 and solid-state switches 40. For example, the programmable controller may include a current measuring element 38 and/or a voltage measuring element 42 that measure the input current through and voltage drop across a respective load. Additionally, the programmable controller may include a temperature measuring element 44 that measures the temperature at or around the solid-state switch. The current and voltage measuring elements are typically made from conventional electrical components such as resistors, capacitors and operational amplifiers. Also, the temperature measuring device can be made from any number of devices, such as the LM75 digital temperature sensor, manufactured by National Semiconductor. In operation, the measuring elements protect the loads 14 and/or solid-state switches 40 from undesirable conditions such as over-current, over and under voltage, and over and under temperature conditions by comparing such measured parameters against predetermined values for the respective load and/or switch. For example, the predetermined value for each load may be based upon material characteristics of the load, such as a maximum current or voltage rating, or a minimum operational voltage. Also, for example, the predetermined temperature value for each solid-state switch may comprise a maximum temperature rating for the respective solid-state switch, over which damage is caused to the solid-state switch. Additionally, the predetermined value based upon current or voltage rating characteristics can additionally take into account the predetermined temperature value because the current and voltage characteristics of various loads typically change over a range of temperatures.

Referring to FIG. 5, typically, the controller processing element 36 compares the measured parameters against the predetermined values by first constructing a model trip curve 50 comprising a plurality of measured parameter values at different points in time. The controller processing element compares the model trip curve against a characteristic trip curve 52 for the respective load and/or switch. The characteristic trip curve is typically predefined based upon a characteristic of the switch and/or load associated with the particular parameter, such as a current rating characteristic trip curve associated with the measured input current through the switch and/or to the load. FIG. 5 illustrates a characteristic trip curve along with a constructed model trip curve for a switch and/or a load with a ten amp current rating. Although not illustrated, the characteristic trip curve can additionally be predefined based upon a combination of the various parameters associated with the switch and/or load, such as the temperature of the switch and/or load along with another parameter of the switch and/or load since many parameters of the switch and/or load may vary depending on the temperature of the switch and/or load. The characteristic trip curve is stored by the controller processing element or an associated memory device, thus making any trip curve implementation possible, such as $I^2T$ and tiered. The predetermined values of the characteristic trip curve are defined to prevent the solid-state switch and/or load from operating too long in a dangerous area 56. By referencing the characteristic trip curve, the controller processing element can keep the measured parameter in a safe area 58, such as below the current rating of the switch and/or the load, and turn off the switch before the switch and/or load can be damaged by crossing a critical point 54 on the characteristic trip curve. If the condition measured by the respective measuring element falls outside the range of predetermined values or above the predetermined value or, more typically, if the model trip curve constructed by the controller processing element based upon the measured parameter or parameters is predicted to reach the critical point on the characteristic trip curve, the controller processing element alters the input current through the solid-state switch accordingly. For example, if the controller processing element in conjunction with the measuring element determine that the input current to the load will remain at or above a certain level for more than the maximum time permitted by the characteristic trip curve within a predefined period of time, the controller processing element can alter the input current to bring the measured value within the predetermined value range or below the predetermined value or, preferably, the controller processing element can place the solid-state switch in the on or off mode.

In another advantageous embodiment, when the input current to the switch and/or the load reaches or exceeds a certain level, such as a maximum current rating or an input current rating, respectively, the controller processing element repeatedly increases a count. If the count exceeds a predetermined threshold representative of the predefined period of time, the controller processing element can alter the input current to reduce the input current to below the certain level, such as by placing the switch in the off mode. But if the input current to the load decreases to below the certain level before the count exceeds the threshold, the controller processing element will repeatedly decrease the count. In this regard, the controller processing element can account for previous current stress (e.g., excess current) to the switch and/or the load should the switch and/or the load experience a subsequent current stress before the count reaches zero since the count would begin upward again, although not from zero but from a value representative of the residual stress on the switch and/or the load.

Referring now to FIG. 6, a method of remotely controlling the input current from the controller processing element 36 through each switch 40 to each load 14, according to one embodiment of the present invention, begins by configuring the firmware of the controller processing element based upon the desired characteristics of the switches and loads, such as current and voltage ratings of each load, a maximum current rating of each switch and/or a temperature rating of each switch, as shown in block 100. For example, the firmware can be configured with the characteristic trip curves typically predefined based upon the characteristics of the switch and/or load. Additionally, the characteristic trip curves can be predefined based upon a combination of the various characteristics of the switch and/or load, such as the temperature of the switch and/or load along with another parameter of the switch and/or load since many parameters of the switch and/or load may vary depending on the temperature of the switch and/or load. Thus, different characteristic trip curves can be utilized depending upon the temperature of the switch. Additionally, or alternatively, the characteristics of each switch related to current through the switch, such as the maximum current rating, can be configured into the respective switch-protection element 42 to monitor the actual current through the respective switch. Advantageously, by configuring the controller processing element with the characteristics of the switches and loads, if a switch or load with different characteristics is connected to the power system, the controller processing element can be reconfigured such as by constructing and storing the characteristic trip curves associated with the different switch or load, as opposed to replacing the discrete components of conventional circuit breakers and relays.

After the controller processing element 36 has been configured, the damaged wire detector 16 can operate to determine whether any of the conductors are damaged and, if so, determine the location of the damage. Referring now to FIG. 6B, a method of detecting and locating each damage in each conductor begins by transmitting a set of test pulses, such as a set of 1 microsecond, 5 volt analog pulses, down the conductors, as shown in block 122. The comparator 26 can then receive reflections of the test pulses, and thereafter compare the convert the analog reflections to digital data representative of the reflections, as shown in block 124. In this regard, the comparator preferably compares the reflection of each test pulse to a threshold signal of a different magnitude, such as by comparing the test pulses to threshold signals ranging from +7 volts to −7 volts in approximately 0.78 volt increments.

The digital data representative of the reflections can then be compared to reference digital data to determine whether the digital data is within a threshold of the reference digital data. More particularly, the transit time required for each test pulse to travel down the conductors and reflect back can be determined from the digital data, which can thereafter be converted to a length. The length can then be compared against a reference length determined from the reference digital data to thereby determine if the length determined from the digital data is lengthwise within a threshold of the reference length. In this regard, the reference digital data can be representative of reflections from known properly operating conductors of the same length and makeup as the conductors tested, as shown in block 126. The reference digital data can be generated in any of a number of different manners but, in one embodiment described below, the reference digital data is generated by training the damaged wire detector 16 using the conductors at an instance in which it is known that the conductors are functioning properly, such as just after configuring the programmable controller 10 with the damaged wire detector and the loads 14. The threshold can equally be set in any of a number of different manners. In one embodiment, for example, the threshold is set at five percent of the reference digital data (i.e., the distance determined from the digital data is within five percent of the distance determined from the reference digital data).

During the comparison, if the digital data is within a threshold of the reference digital data, the conductor is considered to be functioning properly without any damage. Thereafter, a determination is made as to whether all of the conductors have been tested for damage, as shown in block 130. If all of the conductors have not been tested, another conductor is selected, as shown in block 132. The process can then repeat for the next conductor, beginning with issuing the test pulses down the next conductor, as shown in block 122.

If the digital data is not within the threshold of the reference digital data, the processing element 18 can store the digital data and report the damaged conductor, such as to the programmable controller 10. In a more typical embodiment, however, if the digital data is not within the threshold of the reference digital data, the one or more subsequent tests are performed on the same conductor to verify the damage to the conductor. In this regard, if the digital data is not within the threshold of the reference digital data, the processing element determines whether a predetermined number of passes (e.g., two) have been taken at the respective conductor, as shown in block 134. In other terms, the processing element determines if the respective conductor has failed the test a predetermined number of times by failing to be within the threshold of the reference digital data during any such test. If the predetermined number of passes have not been taken, the process can repeat for the respective conductor, such as beginning with issuing the test pulses, as shown in block 122.

If the predetermined number of passes have been taken and damage has been detected with each pass, however, the processing element can store the digital data and report the damaged conductor (FAULT ALERT), as shown in block 136 and described more fully below. As will be appreciated, if the programmable controller receives notification that a conductor is damaged, such as by the digital data for the respective conductor not being within the reference digital data after a predetermined number of passes, the programmable controller will typically prevent current from being applied to the respective conductor, as such is described above.

After testing the conductors with the damaged wire detector 16, and presuming the damaged wire detectors do not detect a damaged conductor, each switch 40 is operated in the on mode, as desired, to provide the input current to the respective load 14, as shown in block 102. As the switch is operating in the on mode, the switch-protection element senses the actual current through the switch, as illustrated in block 104. If the actual current is above a predetermined value, such as the maximum current rating of the switch, the switch-protection element can wait a predetermined amount of time to allow any inrush of current to settle to a stable level, as shown in blocks 106 and 108. Additionally, or alternatively, the switch-protection element can be configured to control the actual current at different times or in different modes of operation. For example, the switch-protection element and/or controller processing element can be configured to step down the predetermined value from an initial, elevated value to a stable value at the conclusion of the predetermined amount of time. If, after the predetermined amount of time the actual current is still above the predetermined value, the switch-protection element reduces the actual current, such as by placing the switch in the off mode, as shown in blocks 111 and 120). In the event the actual current is below the predetermined value, either initially or after the predetermined period of time, the switch-protection element continuously monitors the actual current to ensure the actual current remains below the predetermined value, as shown in blocks 110 and 111.

As the switch-protection element 46 monitors the switch 40 for an over-current situation, the controller processing element 36 periodically samples the current and/or voltage through and/or across the load 14, and/or samples the temperature of or around the switch to use to obtain a condition of the load and/or switch, as illustrated in block 112. The condition is then determined by comparing the current, voltage and/or temperature against the characteristics predefined by the controller processing element.

The controller processing element can determine if an over temperature or under temperature condition exists in the switch, as shown in block 114. And if so, the controller processing element can alter the input current accordingly. For example, the temperature measuring element can measure the air temperature at or around the switch and compare the measured temperature against the predetermined values for the desired temperature range, such as critical temperature limits. If the measured temperature is below or above the desired temperature range, the controller processing element can place the respective switch in the off mode to prevent the switch from being damaged or from damaging the respective load, as shown in block 120. Alternatively, the controller processing element can construct different characteristic trip curves based upon other parameters to emulate the temperature at or around the switch based upon characteristics of the switch that vary in proportion to the temperature of the switch.

The controller processing element can also determine if an over voltage or under voltage condition exists in the load 14 and alter the input current accordingly, as shown in block 116. For example, if the measured voltage drop across a respective load falls outside the preconfigured voltage range for the respective load, the controller processing element 36 can alter the input current to place the voltage drop within the desired levels or place the respective switch 40 in the off mode.

The controller processing element 36 can also determine if an over current condition exists in the load 14 and, if so, alter the input current to below the predetermined level, as shown in block 124. For example, the controller processing element can determine a model trip curve 50 using a plurality of measured parameter values at different points in time. The controller processing element compares the model trip curve against the characteristic trip curve 52 for the respective load and/or switch 40. The predetermined values in the characteristic trip curve are defined to prevent the switch from operating too long in the dangerous area 56. Additionally, the controller processing element can account for previous current stresses (e.g., previous switch operations in the dangerous area) by maintaining a count. As the switch operates in the dangerous area, the controller processing element repeatedly increases the count. And if the switch returns to operating outside of the dangerous area before the count reaches a predetermined threshold (representative of the maximum amount of time the switch is allowed to operate in the dangerous area), the controller processing element can repeatedly decrease the count as long as the switch remains outside the dangerous area, as previously described. By referencing the characteristic trip curve, the controller processing element can turn off the switch before the switch and/or load can be damaged, such as by placing the switch in the off mode, as shown in block 120.

As indicated above, the reference digital data can be generated in any of a number of different manners but, in one embodiment, the reference digital data is generated by training the damaged wire detector 16 using the conductors at an instance in which it is known that the conductors are functioning properly. In this regard, in one embodiment, before the conductors are tested, the damaged wire detector can enter a maintenance mode whereby the conductors proceed through a training process to generate reference digital data that is thereafter stored for subsequent use during testing of the conductors. During training of the damaged wire detector, the processing element can transmit a set of test pulses down the conductors and receive reflections back from the conductors. The reflections can then be converted into digital data representative of the reflections by passing the analog reflections through the comparator 26 with the reflection for each test pulse compared to a threshold signal of a different magnitude. The digital data can then pass through the FIFO 32 to the processing element 18, which stores the digital data as reference digital data.

In addition to training, the damaged wire detector 16 can enter the maintenance mode to perform a number of other maintenance/troubleshooting functions of the system. For example, in instances in which the processing element 18 has stored digital data associated with a failed test, the damaged wire detector can enter maintenance mode to thereby extract and, if desired, further analyze the digital data. The digital data can be extracted from the processing element in any of a number of different known manners by another processing device, such as a personal computer, laptop computer or other high level processor. Thereafter, if desired, the digital data can be further analyzed to determine the location of the damage in the conductors.

In one embodiment, the digital data, as well as the reference digital data, can be presented on a display, such as by plotting each as a separate waveform. In this regard, FIG. 7 illustrates an example of digital data plotted against reference digital data for a conductor having a length of fifty feet terminated at a load. As shown, the reference digital data (left plot) is compared against the digital data (right plot) acquired in accordance with embodiments of the present invention. As shown, the digital data (right plot) differs substantially from the reference digital data (left plot). Thus, the display of FIG. 7 may illustrate a damaged conductor. Further, as shown at the bottom of the display of FIG. 7, the length of the conductor is determined to equal 12.55 feet, which differs substantially from the actual length of the conductor, fifty feet. In contrast, in instances in which the conductor is not damaged, the reference digital data (left plot) is typically substantially similar to the digital data (right plot).

In another embodiment of the present invention, shown in FIG. 8, the system can further include an arc fault detector 70 electrically connected between the programmable controller 10 and the loads 14. In this embodiment, the arc fault detector is capable of monitoring the current flow through the programmable controller for anomalies associated with an arc event. Then, when one or more such anomalies are identified by the arc fault detector, the arc fault detector can notify the programmable controller of the event so that the programmable controller can place respective switches 40 in the off mode to prevent the respective load from being damaged by an arc event. For more information on such an arc fault detector 70, as well as the system including both the damaged wire detector 16 and the arc fault detector, see U.S. patent application Ser. No. 10/662,565, entitled: System and Method for Remotely Detecting Electric Arc Events in A Power System, filed Sep. 15, 2003; and U.S. patent application Ser. No. 10/663,584, entitled: System and Method for Remotely Detecting and Locating Faults in A Power System, filed concurrently herewith, the contents of both of which are hereby incorporated by reference in their entirety.

Embodiments of the present invention therefore provide a system and method for remotely detecting and locating damaged conductors that allows for non-intrusive testing of the power cables. As such, wear and tear on cable connectors can be reduced, and maintenance personnel can be kept from having to enter cramped quarters to conduct tests. By keeping personnel from having to enter cramped quarters, the potential of secondary damage can be reduced due to wiring being disturbed by personnel crawling on the wires. Being able to test wiring from external locations can also reduce unnecessary vehicle or structure entry and reduce the potential for incidental damage. Further, cable inspection times can be reduced due to automated processes and being able to conduct test from external to system locations.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system of remotely detecting and locating damaged conductors, said system comprising:
   at least one slave controller disposed proximate at least one load and electrically connected to the at least one load via at least one conductor, wherein the at least one slave controller comprises:
      at least one solid-state switch capable of controllably altering the input current to the at least one load; and
      at least one measuring element for measuring at least one parameter associated with the at least one load and the at least one solid-state switch, wherein said solid-state switch controllably alters the input current to the at least one load according to the at least one parameter; and
   at least one damaged wire detector electrically connected to the at least one conductor between the at least one slave controller and the at least one load, wherein the at least one damaged wire detector is capable of at least one of detecting and locating at least one damaged conductor.

2. A system according to claim 1, wherein each damaged wire detector is capable of notifying a respective slave controller when the damaged wire detector detects a damaged conductor such that the at least one solid-state switch of the respective slave controller can alter the input current to the at least one load.

3. A system according to claim 1, wherein the at least one solid-state switch operates in at least one mode selected from a group consisting of an on mode wherein the at least one solid-state switch permits a respective load to receive the input current, and an off mode wherein the at least one solid-state switch prevents the respective load from receiving the input current, and wherein when the at least one solid-state switch operates in the off mode the at least one damaged wire detector is capable of testing the at least one conductor to thereby at least one of detect and locate at least one damaged conductor before the at least one solid-state switch is placed in the on mode.

4. A system according to claim 1, wherein each damaged wire detector is capable of at least one of detecting and locating at least one damaged conductor by:
   transmitting at least one test pulse along at least one respective conductor and receiving at least one reflection from the at least one respective conductor; and
   comparing the at least one reflection to reference data to thereby at least one of detect and locate at least one damaged conductor.

5. A system according to claim 4, wherein each damaged wire detector is further capable of converting the at least one reflection to digital data representative of the at least one reflection, and wherein each damaged wire detector is capable of comparing the at least one reflection to reference data by comparing the digital data to the reference data.

6. A system according to claim 5, wherein each damaged wire detector is capable of converting the at least one reflection to digital data with at least one resolution.

7. A system according to claim 4, wherein each damaged wire detector is further capable of determining at least one length of the at least one conductor based upon at least one transit time between transmission of the at least one test pulse and reception of the respective at least one reflection, and wherein each damaged wire detector is capable of comparing the at least one reflection to reference data by comparing the at least one determined length to at least one reference length.

8. A system according to claim 7, wherein each damaged wire detector is capable of comparing the at least one determined length to the at least one reference length includes detecting at least one damaged conductor when the at least one determined length is shorter than the respective at least one reference length by at least a threshold length, and wherein each damaged wire detector is capable of locating the damage as a point on the respective at least one conductor at the at least one determined length.

9. A method of remotely detecting and locating damaged conductors comprising:
   configuring a processing element that controls input current through at least one switch to at least one load via at least one conductor, wherein the configuring is based upon at least one characteristic selected from a group consisting of a current rating of each load, a voltage rating of each load, a maximum current rating of each switch and a temperature rating of each switch;
   operating each switch in an off mode wherein each switch prevents the input current from flowing to a respective load;
   testing the at least one conductor to thereby at least one of detect and locate at least one damaged conductor;
   operating each switch in an on mode wherein each switch permits the input current from flowing to a respective load when no damaged conductors are detected, and thereafter controlling the input current to the at least one load, wherein controlling the input current comprises:
      monitoring at least one parameter associated with each switch and respective load selected from a group consisting of the input current to the load, a voltage drop across the load, the input current through the switch and a temperature of the switch;
      determining a condition of each switch and respective load depending upon at least one of the at least one characteristic and the at least one parameter; and operating each switch in at least one mode selected from a group consisting of the on mode and the off mode depending upon the condition of the respective loads.

10. A method according to claim 9, wherein testing the at least one conductor comprises:
    transmitting at least one test pulse along at least one respective conductor and receiving at least one reflection from the at least one respective conductor; and
    comparing the at least one reflection to reference data to thereby at least one of detect and locate at least one damaged conductor.

11. A method according to claim 10, wherein testing the at least one conductor further comprises converting the at least one reflection to digital data representative of the at least one reflection, and wherein comparing the at least one reflection to reference data comprises comparing the digital data to the reference data.

12. A method according to claim 11, wherein converting the at least one reflection comprises converting the at least one reflection to digital data with at least one resolution.

13. A method according to claim 10, wherein testing the at least one conductor further comprises determining at least one length of the at least one conductor based upon at least one transit time between transmission of the at least one test pulse and reception of the respective at least one reflection, wherein comparing the at least one reflection to reference data comprises comparing the at least one determined length to at least one reference length.

14. A method according to claim 13, wherein comparing the at least one determined length to the at least one reference length comprises detecting at least one damaged conductor when the at least one determined length shorter than the respective at least one reference length by more than a threshold length, and wherein locating the at least one damaged conductor comprises locating a point on the respective at least one conductor at the at least one determined length.

15. A system of remotely detecting and locating damaged conductors, said system comprising:
    at least one load;
    at least one slave controller disposed proximate, and electrically connected to, at least one load, wherein the at least one slave controller is capable of measuring at least one parameter associated with the at least one load, and wherein the at least one slave controller is capable of controllably altering the input current to the at least one load according to the at least one parameter; and
    at least one damaged wire detector electrically connected between the at least one slave controller and the at least one load, wherein the at least one damaged wire detector is capable of at least one of detecting and locating at least one damaged conductor through which input current is delivered to the at least one load.

16. A system according to claim 15, wherein each damaged wire detector is capable of notifying a respective slave controller when the damaged wire detector detects a damaged conductor such that the respective slave controller can alter the input current to the at least one load.

17. A system according to claim 15, wherein the at least one slave controller operates in at least one mode selected from a group consisting of an on mode wherein the at least one slave controller permits a respective load to receive the input current, and an off mode wherein the at least one slave controller prevents the respective load from receiving the input current, and wherein when the at least one slave controller operates in the off mode the at least one damaged wire detector is capable of testing the at least one conductor to thereby at least one of detect and locate at least one damaged conductor before the at least one slave controller is placed in the on mode.

18. A system according to claim 15, wherein each damaged wire detector is capable of at least one of detecting and locating at least one damaged conductor by:
    transmitting at least one test pulse along at least one respective conductor and receiving at least one reflection from the at least one respective conductor; and
    comparing the at least one reflection to reference data to thereby at least one of detect and locate at least one damaged conductor.

19. A system according to claim 18, wherein each damaged wire detector is further capable of converting the at least one reflection to digital data representative of the at least one reflection, and wherein each damaged wire detector is capable of comparing the at least one reflection to reference data by comparing the digital data to the reference data.

20. A system according to claim 19, wherein each damaged wire detector is capable of converting the at least one reflection to digital data with at least one resolution.

21. A system according to claim 18, wherein each damaged wire detector is further capable of determining at least one length of the at least one conductor based upon at least one transit time between transmission of the at least one test pulse and reception of the respective at least one reflection, and wherein each damaged wire detector is capable of comparing the at least one reflection to reference data by comparing the at least one determined length to at least one reference length.

22. A system according to claim 21, wherein each damaged wire detector is capable of comparing the at least one determined length to the at least one reference length includes detecting at least one damaged conductor when the at least one determined length is shorter than the respective at least one reference length by at least a threshold length, and wherein each damaged wire detector is capable of locating the damage as a point on the respective at least one conductor at the at least one determined length.

* * * * *